United States Patent [19]

Fritze

[11] Patent Number: 4,584,686
[45] Date of Patent: Apr. 22, 1986

[54] REED-SOLOMON ERROR CORRECTION APPARATUS

[75] Inventor: Keith R. Fritze, Colorado Springs, Colo.

[73] Assignee: Optical Storage International, Minneapolis, Minn.

[21] Appl. No.: 564,273

[22] Filed: Dec. 22, 1983

[51] Int. Cl.$^4$ ............................................. G06F 11/10
[52] U.S. Cl. .................................................... 371/37
[58] Field of Search ....................... 371/37, 38, 39, 40

[56] References Cited

U.S. PATENT DOCUMENTS 4,142,174  2/1979  Chen et al. ............................. 371/37
4,162,480  7/1979  Berlekamp ............................. 371/37
4,410,989  10/1983 Berlekamp ............................. 371/40

Primary Examiner—Charles E. Atkinson
Attorney, Agent, or Firm—Edward P. Heller, III; Joseph A. Genovese

[57] ABSTRACT

Disclosed is a Reed-Solomon error correction apparatus which is programmable to perform several distinct error correction functions. The apparatus performs the following functions: encoding, error detection, syndrome generation, burst error trapping, and Chien searching.

2 Claims, 6 Drawing Figures

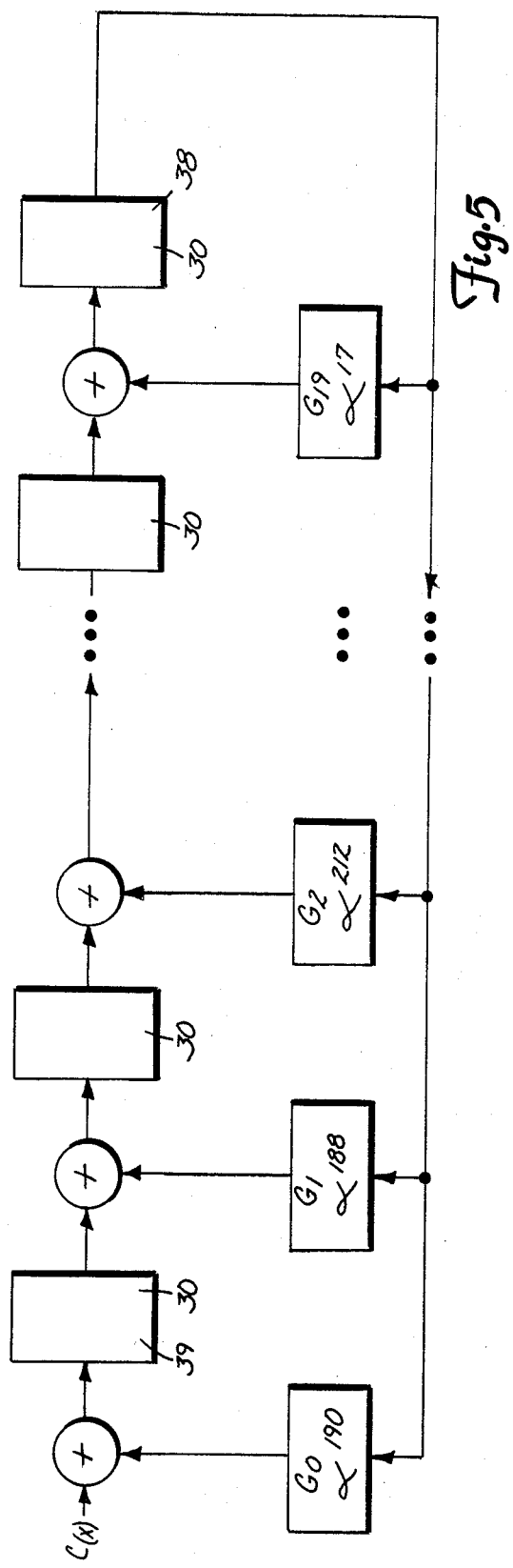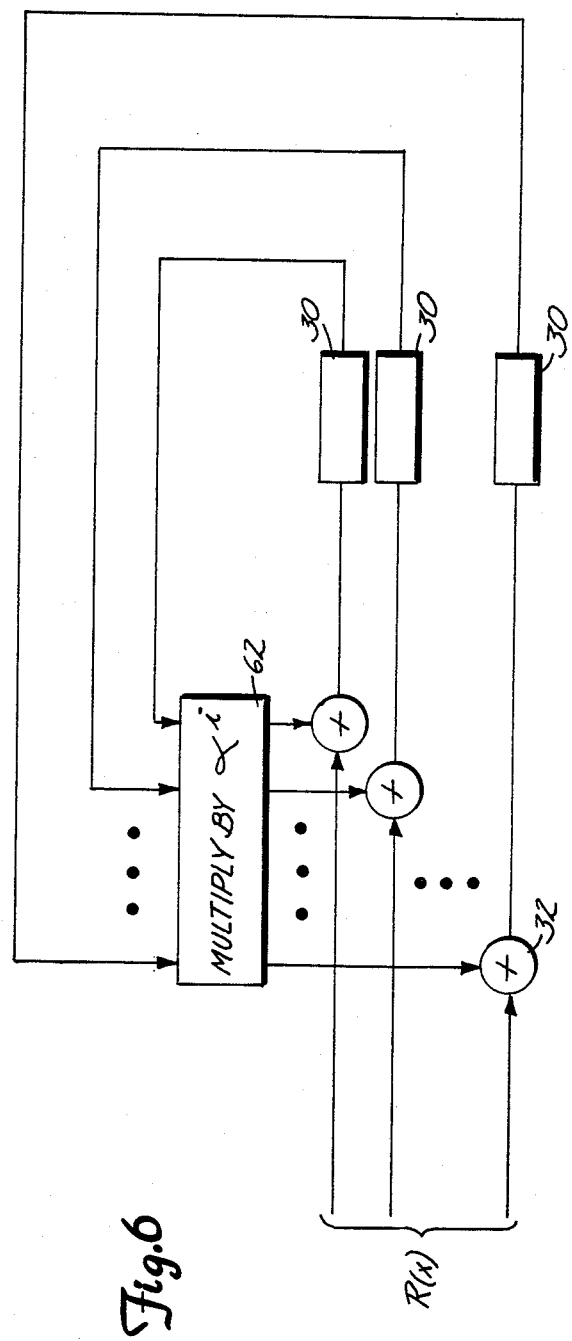

REED-SOLOMON ERROR CORRECTION APPARATUS

BACKGROUND OF THE INVENTION

1. Field of the Invention

The invention relates generally to the field of error correction apparatus and more particularly to Reed-Solomon error correction apparatus.

2. Brief Description of the Prior Art

Reed-Solomon error correction is known in the art. See E. Berlekamp, *Algebraic Coding Theory* (1968) at Chapter 10; Peterson and Weldon, *Error Correcting Codes*, 2nd ed. (1972); S. Lin, *Error-Correcting Codes* (1974); *Key Papers in the Developing of Coding Theory* (1974) (edited by E. Peterson); and Lin and Costello, *Error Control Coding: Fundamentals and Applications* (1983) at 278 and 531-2. See also such references as Chien et al., U.S. Pat. No. 4,142,174, filed Aug. 15, 1977, entitled *High Speed Decoding of Reed Solomon Codes* and Berlekamp U.S. Pat. No. 4,162,480, filed Jan. 28, 1977, entitled *Galois Field Computer*.

According to this art, Reed-Solomon error correcting apparatus have generally utilized a general purpose digital computer to control peripheral arithmetic units implementing Galois Field manipulation.

For large error-correction capability codes, such as a ten-error-correcting code, it is believed that an all hardware implementation of the necessary error correction algorithms would be too expensive. However, an all software implementation of the error correction algorithms would be too slow.

SUMMARY OF THE INVENTION

The present invention employs ten error correcting Reed-Solomon code. Encoding, syndrome generation and Chien searching are performed by the apparatus of the present invention while the coefficients of the error location polynomial and error values are solved by software in a microprocessor. Additionally, the apparatus may perform error detection and burst error trapping.

The error correction apparatus of the present invention uses a common set of registers and two sets of fixed field multipliers to perform all specified error correction functions. The organization of the registers and multipliers is controlled by two sets of multiplexers under control of a controller. The function of the apparatus is programmed by the microprocessor via its control of the controller.

BRIEF DESCRIPTION OF THE DRAWINGS

FIG. 5 is a block diagram of the ECC array connected to perform the Error Detection function;

FIG. 6 is a partial block diagram of the ECC array connected to perform the generation of one syndrome $S_i$.

DESCRIPTION OF THE PREFERRED EMBODIMENT

Figure 1:
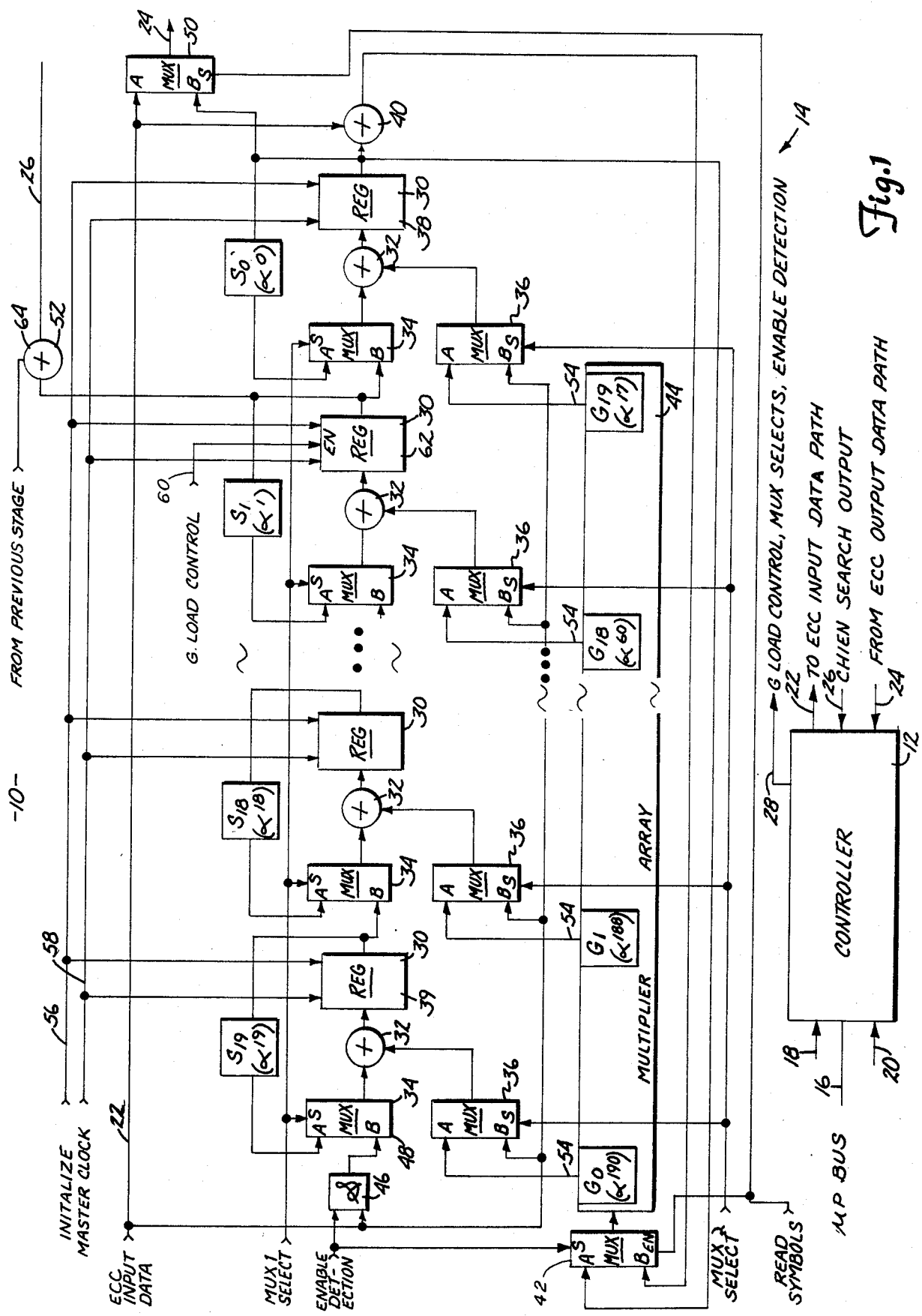
FIG. 1 is a block diagram of the ECC array and controller of the preferred embodiment.

FIG. 1 shows a schematic for a ten-error-correcting Reed-Solomon error correcting apparatus according to the present invention. The mathematics employed in encoding and decoding has been described elsewhere, see especially Chapter 10 of Berlekamp, *Algebraic Coding Theory* (1968) and Chapter 6, especially 6.5 and page 278 of Lin and Costello, *Error Control Coding: Fundamental and Applications* (1983). However, a brief summary is appropriate.

Error correction is essentially a three step process: (1) encoding information, (2) decoding it, and (3) correcting any errors.

Encoding information comprises forming a codeword C(X) of n symbols for transmission of data to, for example, an optical disk recorder for recording. The codeword C(X) comprises k information symbols I(X) and n−k parity check symbols P(X). Each symbol comprises m bits. The parity check symbols are derived by dividing the informtion symbols $X^{n-k}$ I(X) by a generator polynomial G(X). Division results in a quotient Q(X) which is ignored and a remainder r(x). The remainder comprises the parity check symbols which are then added to the n−k lowest order locations of C(X). (Multiplying I(x) by $X^{n-k}$ places the information symbols in the k highest order positions of C(x).) With Reed-Solomon codes the number of parity check symbols to correct an error must be twice the number of errors t that are to be corrected; thus, there must be twenty parity check symbols in a ten-error-correcting code. As the order of the remainder corresponds to the order of the divisor, the generator polynomial implemented for a ten error correcting code has an order of twenty. The generator polynomial itself is comprised of twenty roots, each of the form $X-\alpha^i$, where $\alpha^i$ is a binary m-tuple $$\alpha^i = A_{m-1}\alpha^{m-1} + A_{m-2}\alpha^{m-2} + \ldots A_1\alpha^1 + A_0\alpha^0$$

and α is a root of an irreducible polynomial P(x). In the preferred embodiment, the irreducible polynomial is $$P(X) = X^8 + X^4 + X^3 + X^2 + 1.$$

As $P(\alpha) = 0$, $$\alpha^8 = \alpha^4 + \alpha^3 + \alpha^2 + 1$$

A log table (Table 1) of the elements of Galois Field ($2^8$) represented by this irreducible polynomial follows. The field elements are the powers of $\alpha^i$, i=0, 1, 2 ... 255, modulo ($X^8 + X^4 + X^3 + X^2 + 1$). The number to the left is the number of the field element and corresponds to the power of α of the field element. Within a table entry, the bits correspond to the coefficients $A_i$ of the $\alpha^i$ m-tuple, with the rightmost bit being $A_0$ and the leftmost bit being $A_7$.

TABLE 1

| LOG TABLE GF(256) $P(X) = X^8 + X^4 + X^3 + X^2 + 1$ | | | |
|---|---|---|---|
| 0 | 00000001 | 128 | 10000101 |
| 1 | 00000010 | 129 | 00010111 |
| 2 | 00000100 | 130 | 00101110 |
| 3 | 00001000 | 131 | 01011100 |
| 4 | 00010000 | 132 | 10111000 |
| 5 | 00100000 | 133 | 01101101 |
| 6 | 01000000 | 134 | 11011010 |

TABLE 1-continued

LOG TABLE GF(256)
$P(X) = X^8 + X^4 + X^3 + X^2 + 1$

| # | value | # | value | # | value | # | value |
|---|---|---|---|---|---|---|---|
| 7 | 1 0 0 0 0 0 0 0 | 135 | 1 0 1 0 1 0 0 1 | 87 | 0 1 1 1 1 1 1 1 | 215 | 1 1 1 0 1 1 1 1 |
| 8 | 0 0 0 1 1 1 0 1 | 136 | 0 1 0 0 1 1 1 1 | 88 | 1 1 1 1 1 1 1 0 | 216 | 1 1 0 0 0 0 1 1 |
| 9 | 0 0 1 1 1 0 1 0 | 137 | 1 0 0 1 1 1 1 0 | 89 | 1 1 1 0 0 0 0 1 | 217 | 1 0 0 1 1 0 1 1 |
| 10 | 0 1 1 1 0 1 0 0 | 138 | 0 0 1 0 0 0 0 1 | 90 | 1 1 0 1 1 1 1 1 | 218 | 0 0 1 0 1 0 1 1 |
| 11 | 1 1 1 0 1 0 0 0 | 139 | 0 1 0 0 0 0 1 0 | 91 | 1 0 1 0 0 0 1 1 | 219 | 0 1 0 1 0 1 1 0 |
| 12 | 1 1 0 0 1 1 0 1 | 140 | 1 0 0 0 0 1 0 0 | 92 | 0 1 0 1 1 0 1 1 | 220 | 1 0 1 0 1 1 0 0 |
| 13 | 1 0 0 0 0 1 1 1 | 141 | 0 0 0 1 0 1 0 1 | 93 | 1 0 1 1 0 1 1 0 | 221 | 0 1 0 0 0 1 0 1 |
| 14 | 0 0 0 1 0 0 1 1 | 142 | 0 0 1 0 1 0 1 0 | 94 | 0 1 1 1 0 0 0 1 | 222 | 1 0 0 0 1 0 1 0 |
| 15 | 0 0 1 0 0 1 1 0 | 143 | 0 1 0 1 0 1 0 0 | 95 | 1 1 1 0 0 0 1 0 | 223 | 0 0 0 0 1 0 0 1 |
| 16 | 0 1 0 0 1 1 0 0 | 144 | 1 0 1 0 1 0 0 0 | 96 | 1 1 0 1 1 0 0 1 | 224 | 0 0 0 1 0 0 1 0 |
| 17 | 1 0 0 1 1 0 0 0 | 145 | 0 1 0 0 1 1 0 1 | 97 | 1 0 1 0 1 1 1 1 | 225 | 0 0 1 0 0 1 0 0 |
| 18 | 0 0 1 0 1 1 0 1 | 146 | 1 0 0 1 1 0 1 0 | 98 | 0 1 0 0 0 0 1 1 | 226 | 0 1 0 0 1 0 0 0 |
| 19 | 0 1 0 1 1 0 1 0 | 147 | 0 0 1 0 1 0 0 1 | 99 | 1 0 0 0 0 1 1 0 | 227 | 1 0 0 1 0 0 0 0 |
| 20 | 1 0 1 1 0 1 0 0 | 148 | 0 1 0 1 0 0 1 0 | 100 | 0 0 0 1 0 0 0 1 | 228 | 0 0 1 1 1 1 0 1 |
| 21 | 0 1 1 1 0 1 0 1 | 149 | 1 0 1 0 0 1 0 0 | 101 | 0 0 1 0 0 0 1 0 | 229 | 0 1 1 1 1 0 1 0 |
| 22 | 1 1 1 0 1 0 1 0 | 150 | 0 1 0 1 0 1 0 1 | 102 | 0 1 0 0 0 1 0 0 | 230 | 1 1 1 1 0 1 0 0 |
| 23 | 1 1 0 0 1 0 0 1 | 151 | 1 0 1 0 1 0 1 0 | 103 | 1 0 0 0 1 0 0 0 | 231 | 1 1 1 1 0 1 0 1 |
| 24 | 1 0 0 0 1 1 1 1 | 152 | 0 1 0 0 1 0 0 1 | 104 | 0 0 0 0 1 1 0 1 | 232 | 1 1 1 1 0 1 1 1 |
| 25 | 0 0 0 0 0 0 1 1 | 153 | 1 0 0 1 0 0 1 0 | 105 | 0 0 0 1 1 0 1 0 | 233 | 1 1 1 1 0 0 1 1 |
| 26 | 0 0 0 0 0 1 1 0 | 154 | 0 0 1 1 1 0 0 1 | 106 | 0 0 1 1 0 1 0 0 | 234 | 1 1 1 1 1 0 1 1 |
| 27 | 0 0 0 0 1 1 0 0 | 155 | 0 1 1 1 0 0 1 0 | 107 | 0 1 1 0 1 0 0 0 | 235 | 1 1 1 0 1 0 1 1 |
| 28 | 0 0 0 1 1 0 0 0 | 156 | 1 1 1 0 0 1 0 0 | 108 | 1 1 0 1 0 0 0 0 | 236 | 1 1 0 0 1 0 1 1 |
| 29 | 0 0 1 1 0 0 0 0 | 157 | 1 1 0 0 1 1 0 1 | 109 | 1 0 1 1 1 1 0 1 | 237 | 1 0 0 0 1 0 1 1 |
| 30 | 0 1 1 0 0 0 0 0 | 158 | 1 0 1 1 0 1 1 1 | 110 | 0 1 1 0 0 1 1 1 | 238 | 0 0 0 0 1 0 1 1 |
| 31 | 1 1 0 0 0 0 0 0 | 159 | 0 1 1 1 0 0 1 1 | 111 | 1 1 0 0 1 1 1 0 | 239 | 0 0 0 1 0 1 1 0 |
| 32 | 1 0 0 1 1 1 0 1 | 160 | 1 1 1 0 0 1 1 0 | 112 | 1 0 0 0 0 0 0 1 | 240 | 0 0 1 0 1 1 0 0 |
| 33 | 0 0 1 0 0 1 1 1 | 161 | 1 1 0 1 0 0 0 1 | 113 | 0 0 0 1 1 1 1 1 | 241 | 0 1 0 1 1 0 0 0 |
| 34 | 0 1 0 0 1 1 1 0 | 162 | 1 0 1 1 1 1 1 1 | 114 | 0 0 1 1 1 1 1 0 | 242 | 1 0 1 1 0 0 0 0 |
| 35 | 1 0 0 1 1 1 0 0 | 163 | 0 1 1 0 0 0 1 1 | 115 | 0 1 1 1 1 1 0 0 | 243 | 0 1 1 1 1 1 0 1 |
| 36 | 0 0 1 0 0 1 0 1 | 164 | 1 1 0 0 0 1 1 0 | 116 | 1 1 1 1 1 0 0 0 | 244 | 1 1 1 1 1 0 1 0 |
| 37 | 0 1 0 0 1 0 1 0 | 165 | 1 0 0 1 0 0 0 1 | 117 | 1 1 1 0 1 1 0 1 | 245 | 1 1 1 0 1 0 0 1 |
| 38 | 1 0 0 1 0 1 0 0 | 166 | 0 0 1 1 1 1 1 1 | 118 | 1 1 0 0 0 1 1 1 | 246 | 1 1 0 0 1 1 1 1 |
| 39 | 0 0 1 1 0 1 0 1 | 167 | 0 1 1 1 1 1 1 0 | 119 | 1 0 0 1 0 0 1 1 | 247 | 1 0 0 0 0 0 1 1 |
| 40 | 0 1 1 0 1 0 1 0 | 168 | 1 1 1 1 1 1 0 0 | 120 | 0 0 1 1 1 0 1 1 | 248 | 0 0 0 1 1 0 1 1 |
| 41 | 1 1 0 1 0 1 0 0 | 169 | 1 1 1 0 0 1 0 1 | 121 | 0 1 1 1 0 1 1 0 | 249 | 0 0 1 1 0 1 1 0 |
| 42 | 1 0 1 1 0 1 0 1 | 170 | 1 1 0 1 0 1 1 1 | 122 | 1 1 1 0 1 1 0 0 | 250 | 0 1 1 0 1 1 0 0 |
| 43 | 0 1 1 1 0 1 1 1 | 171 | 1 0 1 1 0 0 1 1 | 123 | 1 1 0 0 0 1 0 1 | 251 | 1 1 0 1 1 0 0 0 |
| 44 | 1 1 1 0 1 1 1 0 | 172 | 0 1 1 1 1 0 1 1 | 124 | 1 0 0 1 0 1 1 1 | 252 | 1 0 1 0 1 1 0 1 |
| 45 | 1 1 0 0 0 0 0 1 | 173 | 1 1 1 1 0 1 1 0 | 125 | 0 0 1 1 0 0 1 1 | 253 | 0 1 0 0 0 1 1 1 |
| 46 | 1 0 0 1 1 1 1 1 | 174 | 1 1 1 1 0 0 0 1 | 126 | 0 1 1 0 0 1 1 0 | 254 | 1 0 0 0 1 1 1 0 |
| 47 | 0 0 1 0 0 0 1 1 | 175 | 1 1 1 1 1 1 1 1 | 127 | 1 1 0 0 1 1 0 0 | 255 | 0 0 0 0 0 0 0 1 |
| 48 | 0 1 0 0 0 1 1 0 | 176 | 1 1 1 0 0 0 1 1 | | | | |
| 49 | 1 0 0 0 1 1 0 0 | 177 | 1 1 0 1 1 0 1 1 | | | | |
| 50 | 0 0 0 0 0 1 0 1 | 178 | 1 0 1 0 1 0 1 1 | | | | |
| 51 | 0 0 0 0 1 0 1 0 | 179 | 0 1 0 0 1 0 1 1 | | | | |
| 52 | 0 0 0 1 0 1 0 0 | 180 | 1 0 0 1 0 1 1 0 | | | | |
| 53 | 0 0 1 0 1 0 0 0 | 181 | 0 0 1 1 0 0 0 1 | | | | |
| 54 | 0 1 0 1 0 0 0 0 | 182 | 0 1 1 0 0 0 1 0 | | | | |
| 55 | 1 0 1 0 0 0 0 0 | 183 | 1 1 0 0 0 1 0 0 | | | | |
| 56 | 0 1 0 1 1 1 0 1 | 184 | 1 0 0 1 0 1 0 1 | | | | |
| 57 | 1 0 1 1 1 0 1 0 | 185 | 0 0 1 1 0 1 1 1 | | | | |
| 58 | 0 1 1 0 1 0 0 1 | 186 | 0 1 1 0 1 1 1 0 | | | | |
| 59 | 1 1 0 1 0 0 1 0 | 187 | 1 1 0 1 1 1 0 0 | | | | |
| 60 | 1 0 1 1 1 0 0 1 | 188 | 1 0 1 0 0 1 0 1 | | | | |
| 61 | 0 1 1 0 1 1 1 1 | 189 | 0 1 0 1 0 1 1 1 | | | | |
| 62 | 1 1 0 1 1 1 1 0 | 190 | 1 0 1 0 1 1 1 0 | | | | |
| 63 | 1 0 1 0 0 0 0 1 | 191 | 0 1 0 0 0 0 0 1 | | | | |
| 64 | 0 1 0 1 1 1 1 1 | 192 | 1 0 0 0 0 0 1 0 | | | | |
| 65 | 1 0 1 1 1 1 1 0 | 193 | 0 0 0 1 1 0 0 1 | | | | |
| 66 | 0 1 1 0 0 0 0 1 | 194 | 0 0 1 1 0 0 1 0 | | | | |
| 67 | 1 1 0 0 0 0 1 0 | 195 | 0 1 1 0 0 1 0 0 | | | | |
| 68 | 1 0 0 1 1 0 0 1 | 196 | 1 1 0 0 1 0 0 0 | | | | |
| 69 | 0 0 1 0 1 1 1 1 | 197 | 1 0 0 0 1 1 0 1 | | | | |
| 70 | 0 1 0 1 1 1 1 0 | 198 | 0 0 0 0 0 1 1 1 | | | | |
| 71 | 1 0 1 1 1 1 0 0 | 199 | 0 0 0 0 1 1 1 0 | | | | |
| 72 | 0 1 1 0 0 1 0 1 | 200 | 0 0 0 1 1 1 0 0 | | | | |
| 73 | 1 1 0 0 1 0 1 0 | 201 | 0 0 1 1 1 0 0 0 | | | | |
| 74 | 1 0 0 0 1 0 0 1 | 202 | 0 1 1 1 0 0 0 0 | | | | |
| 75 | 0 0 0 0 1 1 1 1 | 203 | 1 1 1 0 0 0 0 0 | | | | |
| 76 | 0 0 0 1 1 1 1 0 | 204 | 1 1 0 1 1 1 0 1 | | | | |
| 77 | 0 0 1 1 1 1 0 0 | 205 | 1 0 1 0 0 1 1 1 | | | | |
| 78 | 0 1 1 1 1 0 0 0 | 206 | 0 1 0 1 0 0 1 1 | | | | |
| 79 | 1 1 1 1 0 0 0 0 | 207 | 1 0 1 0 0 1 1 0 | | | | |
| 80 | 1 1 1 1 1 1 0 1 | 208 | 0 1 0 1 0 0 0 1 | | | | |
| 81 | 1 1 1 0 0 1 1 1 | 209 | 1 0 1 0 0 0 1 0 | | | | |
| 82 | 1 1 0 1 0 0 1 1 | 210 | 0 1 0 1 1 0 0 1 | | | | |
| 83 | 1 0 1 1 1 0 1 1 | 211 | 1 0 1 1 0 0 1 0 | | | | |
| 84 | 0 1 1 0 1 0 1 1 | 212 | 0 1 1 1 1 0 0 1 | | | | |
| 85 | 1 1 0 1 0 1 1 0 | 213 | 1 1 1 1 0 0 1 0 | | | | |
| 86 | 1 0 1 1 0 0 0 1 | 214 | 1 1 1 1 1 0 0 1 | | | | |

The generator polynomial for a ten-error-correcting Reed-Solomon code having $n = 2^m - 1$, m-bit symbols where $m = 8$ in the preferred embodiment is as follows:

$$G(X) = \prod_{i=0}^{2t-1} (X - \alpha^i), \text{ or}$$

$$G(X) = X^{20} + \alpha^{17}X^{19} + \alpha^{60}X^{18} + \alpha^{79}X^{17} + \alpha^{50}X^{16} + \alpha^{61}X^{15} +$$

$$\alpha^{163}X^{14} + \alpha^{26}X^{13} + \alpha^{187}X^{12} + \alpha^{202}X^{11} + \alpha^{180}X^{10} +$$

$$\alpha^{221}X^9 + \alpha^{225}X^8 + \alpha^{83}X^7 + \alpha^{239}X^6 + \alpha^{156}X^5 +$$

$$\alpha^{164}X^4 + \alpha^{212}X^3 + \alpha^{212}X^2 + \alpha^{188}X + \alpha^{190}.$$

The code word C(X) thus transmitted is a multiple of both the generator polynomial and each of its factors or roots. Thus, the division of the received word R(X) by the generator polynomial or each of its roots, if the received word contains no errors, results in some quotient and a remainder of zero. To check if a received word contains errors, one may divide the received word either by the generator polynomial or by all of its roots and then test whether the remainder or remainders are all zero.

For error correction purposes, it is necessary to generate a number of syndromes equal to twice the number of errors being corrected. In the preferred embodiment, as ten errors are being corrected, twenty syndromes must be generated. The syndrome can be defined as the remainder after dividing the received word R(X) by a root $(X-\alpha^i)$ of the generator polynomial G(X). This is equivalent to evaluating the received word polynomial R(x) at $\alpha^i$, i.e., $R(\alpha^i)$. As there are twenty such roots, there are twenty syndromes. The syndromes are mathematically related to error locations and error values by the relationship $$S_j = \sum_i Y_i X_i^j,$$

where the $X_i$ are the error locations and the $Y_i$ are the error values, and $S_j = R(\alpha^j)$. Therefore, $$R(\alpha^j) = \sum_i Y_i X_i^j.$$

$X_i$ is an element of $GF(2^8)$ and is a power of $\alpha$ mod $(X^8+X^4+X^3+X^2+1)$. The power of $\alpha$ corresponds to the location of the symbol in error, i.e., if $X_i = \alpha^{95}$, the 95th symbol of R is in error. The error value $Y_i$ is also an element of $GF(2^8)$ and corresponds directly with the error pattern. Thus the code can correct all eight-bit error patterns of a symbol in error.

The error locations can be derived from the syndromes in the following manner: First, the coefficients of an error location polynomial are calculated according to Berlekamp's Algorithm given on page 154 of his *Algebraic Coding Theory*. See also pp. 155–8 of Lin and Costello. The error location polynomial of the form $$\alpha(X) = \sigma_{10} x^{10} + \sigma_9 x^9 + \sigma_8 x^8 + \ldots + \sigma_2 x^2 + \sigma_1 x + 1 = 0$$

for a ten error correcting code. This equation is related to the error locations $X_i$ by the following:

$$\sigma(X) = \pi(1 - X_i x)$$

If the polynomial $\sigma(X)$ is evaluated at $\alpha^j$, where $-j$ corresponds to a received word location, the first form of the error location polynomial will sum to zero when $\alpha - j$ is a root of $\sigma(X)$, i.e., when $1 - X_i \alpha^j = 0$. This occurs where $X_i = \alpha^{-j}$. A Chien Search for the error locations comprises evaluating the first form of the polynomial $\sigma(X)$ for each power of $\alpha^j$, $j = 0, 1, 2, 3 \ldots k$ (k being the number of the information symbols) and checking if the result is zero or non-zero.

This search shortened by ignoring errors in the parity check symbols and not evaluating the polynomial at powers of $\alpha$ corresponding to the locations of the parity check symbols.

Once the error locations $X_i$ have been located through a Chien search, the error values $Y_i$ may be evaluated. An error polynomial S(z) is defined by $$S(z) = 1 + (S_1 + \sigma_1)z + (S_2 + \sigma_1 S_1 + \sigma_2)z^2 + \ldots (S_\nu + \sigma_1 S_{\nu-1} + \sigma_2 S_{\nu-2} + \ldots + \sigma_\nu)z^\nu$$

where $\nu$ is the number of errors (max.). By substituting the reciprocals of the error locations $X_i$ for z, or $z = X_i^{-1}$, in the following error evaluator polynomial, the error values $Y_i$ may be determined.

$$Y_i = \frac{S(X_i^{-1})}{\prod_{\substack{j=1 \\ j \neq i}}^{\nu} (1 + X_j X_i^{-1})}$$

THE HARDWARE

Having described the mathematical background for Reed-Solomon error correction, the various elements of the error correction apparatus according to the present invention will now be described. The operation of the apparatus will be described later.

The error correction apparatus 10 is comprised of two major elements: a controller 12 and an ECC array section 14. The controller 12 is connected to a microprocessor (not shown) through a bus 16 for the bi-directional transfer of data. It is also connected through a read/write line 18 for controlling the direction of data on the bus 16 and clear line 20. The controller 12 is connected to the ECC array 14 through ECC input data path 22, ECC output data path 24, Chien search output data path 26, and miscellaneous control signals 28. The bi-directional data bus 16, the ECC input data path 22, the ECC output data path 24 and the Chien search output data path 26 are all eight line connections for transmitting eight bits in parallel.

Turning now to the ECC array 14, the ECC array is comprised of twenty registers 30 whose inputs are respectively connected to twenty exclusive-OR gates 32. The two sets of inputs to the exclusive-OR gates are respectively connected one set to the outputs of twenty top multiplexers 34 and another set to the outputs of twenty bottom multiplexers 36. The outputs of each of the registers 30 are inversely respectively connected to twenty Galois Field multipliers $S_0$ through $S_{19}$. The outputs of the respective multipliers $S_0$ and $S_{19}$ are provided as the A inputs to the inversely corresponding top multiplexers 34. Additionally, the highest order register 38 of the registers 30 has its outputs connected to a lead exclusive-OR gate 40, whose outputs are connected as a feedback connection through a feedback multiplexer 42 ("B" inputs) to Galois Field parallel multiplier array 44, $G_0$ to $G_{19}$. Additionally, the outputs of this register 38 are provided directly as the A inputs of a feedback multiplexer 42. The outputs of the respective multipliers, $G_0$ to $G_{19}$ of the parallel multiplier array 44 are provided as the A inputs to the correspondingly ordered lower multiplexers 36, the outputs of which are, in turn, connected as one set of inputs to the correspondingly ordered exclusive-OR gates 32. The ECC input data path 22 is connected first to the exclusive-OR gate 40; second, in parallel to each of the B inputs of the lower multiplexers 36; third, to the ECC output data path via the A inputs of output multiplexer 50; and fourth, as one set of inputs to an AND gate 46, the outputs of which are connected to the B inputs of the lowest order top multiplexer 48. The outputs of the registers 30, save for register 38, are additionally respectively connected to the B inputs of the top multiplexers 34, save for multiplexer 48. The outputs of the registers 30 connected to multipliers $S_1$, $S_2$, $S_3$, $S_4$, $S_5$, $S_6$, $S_7$, $S_8$, $S_9$, and $S_{10}$ are additionally respectively connected as one set of inputs to nine exclusive-OR gates 52 in the following manner: the outputs from register "$S_{10}$" and the outputs from register "$S_9$" are connected as inputs to the first exclusive-OR gate 70 (see FIG. 2). The outputs of this exclusive-OR gate set are connected as a first input set to the next exclusive-OR gate 72 (see FIG. 2); the other inputs to this next exclusive-OR gate 72 are from the register "$S_8$"; the outputs of this next exclusive-OR gate 22 are provided as a first input set to the subsequent exclusive-OR gate 74; the other input set to this subsequent exclusive-OR gate 74 being the outputs from the register "$S_7$", and so on until exclusive-OR gate 64. The outputs of this last exclusive-OR gate 64 are the Chien search outputs 26 to the controller 12.

All of the inputs and outputs of each register 30, multiplexer 34, 36, 42, and 50, exclusive-OR gate 32 and 52, multiplier $S_0$–$S_{19}$, $G_0$–$G_{19}$ are eight bits wide each line corresponding to a power of $\alpha^i$, $i = 0, 1, 2 \ldots 7$. The exclusive-OR's operates on the bits individually, that is, the lowest order bit of one input set is exclusive-ORed with the lowest order bit of the other input set, etc. This is known to the art as Galois Field addition of two symbols. However, the multipliers operate in all eight bits in a group. The logic for the multipliers $S_0$ through $S_{19}$ and $G_0$ through $G_{19}$ are shown in the following table:

TABLE 2
MULTIPLIER LOGIC FOR MULTIPLYING BY $\alpha^i$ $\alpha^0$ ($S_0$)
0 = 0
1 = 1
2 = 2
3 = 3
4 = 4
5 = 5
6 = 6
7 = 7

$\alpha^1$ ($S_1$)
0 = 7
1 = 0
2 = 1 + 7
3 = 2 + 7
4 = 3 + 7
5 = 4
6 = 5
7 = 6

$\alpha^2$ ($S_2$)
0 = 6
1 = 7
2 = 0 + 6
3 = 1 + 6 + 7
4 = 2 + 6 + 7
5 = 3 + 7
6 = 4
7 = 5

$\alpha^3$ ($S_3$)
0 = 5
1 = 6
2 = 5 + 7
3 = 0 + 5 + 6
4 = 1 + 5 + 6 + 7
5 = 2 + 6 + 7
6 = 3 + 7
7 = 4

$\alpha^4$ ($S_4$)
0 = 4
1 = 5
2 = 4 + 6
3 = 4 + 5 + 7
4 = 0 + 4 + 5 + 6
5 = 1 + 5 + 6 + 7
6 = 2 + 6 + 7
7 = 3 + 7

$\alpha^5$ ($S_5$)
0 = 3 + 7
1 = 4
2 = 3 + 5 + 7
3 = 3 + 4 + 6 + 7
4 = 3 + 4 + 5
5 = 0 + 4 + 5 + 6

TABLE 2-continued
MULTIPLIER LOGIC FOR MULTIPLYING BY $\alpha^i$

6 = 1 + 5 + 6 + 7
7 = 2 + 6 + 7

$\alpha^6$ ($S_6$)
0 = 2 + 6 + 7
1 = 3 + 7
2 = 4 + 2 + 6 + 7
3 = 2 + 3 + 5 + 6
4 = 2 + 3 + 4
5 = 3 + 4 + 5
6 = 0 + 4 + 5 + 6
7 = 1 + 5 + 6 + 7

$\alpha^7$ ($S_7$)
0 = 1 + 5 + 6 + 7
1 = 2 + 6 + 7
2 = 1 + 3 + 5 + 6
3 = 1 + 2 + 4 + 5
4 = 1 + 2 + 3 + 7
5 = 2 + 3 + 4
6 = 3 + 4 + 5
7 = 0 + 4 + 5 + 6

$\alpha^8$ ($S_8$)
0 = 0 + 4 + 5 + 6
1 = 1 + 5 + 6 + 7
2 = 0 + 2 + 4 + 5 + 7
3 = 0 + 1 + 3 + 4
4 = 0 + 1 + 2 + 6
5 = 1 + 2 + 3 + 7
6 = 2 + 3 + 4
7 = 3 + 4 + 5

$\alpha^9$ ($S_9$)
0 = 3 + 4 + 5
1 = 0 + 4 + 5 + 6
2 = 1 + 3 + 4 + 6 + 7
3 = 0 + 2 + 3 + 7
4 = 0 + 1 + 5
5 = 0 + 1 + 2 + 6
6 = 1 + 2 + 3 + 7
7 = 2 + 3 + 4

$\alpha^{10}$ ($S_{10}$)
0 = 2 + 3 + 4
1 = 3 + 4 + 5
2 = 0 + 2 + 3 + 5 + 6
3 = 1 + 2 + 6 + 7
4 = 0 + 4 + 7
5 = 0 + 1 + 5
6 = 0 + 1 + 2 + 6
7 = 1 + 2 + 3 + 7

$\alpha^{11}$ ($S_{11}$)
0 = 1 + 2 + 3 + 7
1 = 2 + 3 + 4
2 = 1 + 2 + 4 + 5 + 7
3 = 0 + 1 + 5 + 6 + 7
4 = 3 + 6
5 = 0 + 4 + 7
6 = 0 + 1 + 5
7 = 0 + 1 + 2 + 6

$\alpha^{12}$ ($S_{12}$)
0 = 0 + 1 + 2 + 6
1 = 1 + 2 + 3 + 7
2 = 1 + 4 + 7
3 = 0 + 4 + 5 + 6 + 7
4 = 2 + 5 + 7
5 = 3 + 6
6 = 0 + 4 + 7
7 = 0 + 1 + 5

$\alpha^{13}$ ($S_{13}$)
0 = 0 + 1 + 5
1 = 0 + 1 + 2 + 6
2 = 0 + 2 + 3 + 5 + 7
3 = 0 + 4 + 5 + 7
4 = 1 + 4 + 6 + 7
5 = 2 + 5 + 7
6 = 3 + 6
7 = 0 + 4 + 7

$\alpha^{14}$ ($S_{14}$)
0 = 0 + 4 + 7
1 = 0 + 1 + 5
2 = 1 + 2 + 4 + 6 + 7

TABLE 2-continued

MULTIPLIER LOGIC FOR MULTIPLYING BY $\alpha^i$

3 = 2 + 3 + 4 + 5
4 = 0 + 1 + 6
5 = 1 + 4 + 6 + 7
6 = 2 + 5 + 7
7 = 3 + 6

$\underline{\alpha^{15} (S_{15})}$

0 = 3 + 6
1 = 0 + 4 + 7
2 = 0 + 1 + 3 + 5 + 6
3 = 1 + 2 + 3 + 4 + 7
4 = 2 + 4 + 5 + 6
5 = 0 + 1 + 6
6 = 1 + 4 + 6 + 7
7 = 2 + 5 + 7

$\underline{\alpha^{16} (S_{16})}$

0 = 2 + 5 + 7
1 = 3 + 6
2 = 0 + 2 + 4 + 5
3 = 0 + 1 + 2 + 3 + 6 + 7
4 = 1 + 3 + 4 + 5
5 = 2 + 4 + 5 + 6
6 = 0 + 1 + 6
7 = 1 + 4 + 6 + 7

$\underline{\alpha^{17} (S_{17})}$

0 = 1 + 4 + 6 + 7
1 = 2 + 5 + 7
2 = 1 + 3 + 4 + 7
3 = 0 + 1 + 2 + 5 + 6 + 7
4 = 0 + 2 + 3 + 4
5 = 1 + 3 + 4 + 5
6 = 2 + 4 + 5 + 6
7 = 0 + 1 + 6

$\underline{\alpha^{18} (S_{18})}$

0 = 0 + 1 + 6
1 = 1 + 4 + 6 + 7
2 = 0 + 1 + 2 + 5 + 6 + 7
3 = 0 + 3 + 4 + 6 + 7
4 = 2 + 5 + 7
5 = 0 + 2 + 3 + 4
6 = 1 + 3 + 4 + 5
7 = 2 + 4 + 5 + 6

$\underline{\alpha^{19} (S_{19})}$

0 = 2 + 4 + 5 + 6
1 = 0 + 1 + 6
2 = 1 + 2 + 5 + 7
3 = 0 + 1 + 4 + 7
4 = 0 + 2 + 3 + 5 + 7
5 = 2 + 5 + 7
6 = 0 + 2 + 3 + 4
7 = 1 + 3 + 4 + 5

$\underline{\alpha^{190} (G_0)}$

0 = 1 + 3 + 7
1 = 0 + 2 + 4
2 = 0 + 5 + 7
3 = 0 + 3 + 6 + 7
4 = 3 + 4
5 = 0 + 4 + 5
6 = 1 + 5 + 6
7 = 0 + + 6 + 7

$\underline{\alpha^{188} (G_1)}$

0 = 0 + 1 + 3 + 5
1 = 1 + 2 + 4 + 6
2 = 1 + 2 + 3 + 7
3 = 2 + 5
4 = 1 + 5 + 6
5 = 0 + 2 + 6 + 7
6 = 1 + 3 + 7
7 = 0 + 2 + 4

$\underline{\alpha^{212} (G_2 \text{ and } G_3)}$

0 = 0 + 2 + 3 + 4 + 5 + 6
1 = 1 + 3 + 4 + 5 + 6 + 7
2 = 3 + 7
3 = 0 + 2 + 3 + 5 + 6
4 = 0 + 1 + 2 + 5 + 7
5 = 0 + 1 + 2 + 3 + 6
6 = 0 + 1 + 2 + 3 + 4 + 7
7 = 1 + 2 + 3 + 4 + 5

$\underline{\alpha^{164} (G_4)}$

0 = 1 + 2 + 5 + 6 + 7
1 = 0 + 2 + 3 + 6 + 7
2 = 0 + 2 + 3 + 4 + 5 + 6
3 = 2 + 3 + 4
4 = 1 + 2 + 3 + 4 + 6 + 7
5 = 2 + 3 + 4 + 5 + 7
6 = 0 + 3 + 4 + 5 + 6
7 = 0 + 1 + 4 + 5 + 6 + 7

$\underline{\alpha^{156} (G_5)}$

0 = 1 + 2 + 3 + 5 + 6 + 7
1 = 2 + 3 + 4 + 6 + 7
2 = 0 + 1 + 2 + 4 + 6
3 = 6
4 = 1 + 2 + 3 + 5 + 6
5 = 0 + 2 + 3 + 4 + 6 + 7
6 = 0 + 1 + 3 + 4 + 5 + 7
7 = 0 + 1 + 2 + 4 + 5 + 6

$\underline{\alpha^{239} (G_6)}$

0 = 4 + 6 + 7
1 = 0 + 5 + 7
2 = 0 + 1 + 4 + 7
3 = 1 + 2 + 4 + 5 + 6 + 7
4 = 0 + 2 + 3 + 4 + 5
5 = 1 + 3 + 4 + 5 + 6
6 = 2 + 4 + 5 + 6 + 7
7 = 3 + 5 + 6 + 7

$\underline{\alpha^{83} (G_7)}$

0 = 0 + 1 + 3 + 4 + 6 + 7
1 = 0 + 1 + 2 + 4 + 5 + 7
2 = 2 + 4 + 5 + 7
3 = 0 + 1 + 4 + 5 + 7
4 = 1 + 2 + 3 + 4 + 5 + 7
5 = 0 + 1 + 3 + 4 + 5 + 6
6 = 1 + 2 + 4 + 5 + 6 + 7
7 = 0 + 2 + 3 + 5 + 6 + 7

$\underline{\alpha^{225} (G_8)}$

0 = 3 + 6 + 7
1 = 4 + 7
2 = 0 + 3 + 5 + 6 + 7
3 = 1 + 3 + 4
4 = 2 + 3 + 4 + 5 + 6 + 7
5 = 0 + 3 + 4 + 5 + 6 + 7
6 = 4 + 5 + 6 + 7
7 = 3 + 5 + 6 + 7

$\underline{\alpha^{221} (G_9)}$

0 = 0 + 2 + 7
1 = 3 + 1
2 = 0 + 4 + 7
3 = 1 + 2 + 5 + 7
4 = 3 + 6 + 7
5 = 4 + 7
6 = 0 + 5
7 = 1 + 6

$\underline{\alpha^{180} (G_{10})}$

0 = 1 + 4 + 5
1 = 0 + 2 + 5 + 6
2 = 0 + 3 + 4 + 5 + 6 + 7
3 = 6 + 7
4 = 0 + 1 + 4 + 5 + 7
5 = 1 + 2 + 5 + 6
6 = 2 + 3 + 6 + 7
7 = 0 + 3 + 4 + 7

$\underline{\alpha^{202} (G_{11})}$

0 = 2 + 3 + 4 + 6
1 = 3 + 4 + 5 + 7
2 = 2 + 3 + 5
3 = 2
4 = 0 + 2 + 4 + 6
5 = 0 + 1 + 3 + 5 + 7
6 = 0 + 1 + 2 + 4 + 6
7 = 1 + 2 + 3 + 5 + 7

$\underline{\alpha^{187} (G_{12})}$

0 = 1 + 2 + 4 + 6
1 = 2 + 3 + 5 + 7
2 = 0 + 1 + 2 + 3
3 = 0 + 3 + 6
4 = 0 + 2 + 6 + 7
5 = 1 + 3 + 7
6 = 0 + 2 + 4

TABLE 2-continued
MULTIPLIER LOGIC FOR MULTIPLYING BY $a^i$

```
       7 = 0 + 1 + 3 + 5
    $\alpha^{26}$ (G$_{13}$)
       0 = 6 + 7
       1 = 0 + 7
       2 = 0 + 1 + 6 + 7
       3 = 1 + 2 + 6
       4 = 2 + 3 + 6
       5 = 3 + 4 + 7
       6 = 4 + 5
       7 = 5 + 6
    $\alpha^{163}$ (G$_{14}$)
       0 = 0 + 2 + 3 + 6 + 7
       1 = 0 + 1 + 3 + 4 + 7
       2 = 1 + 3 + 4 + 5 + 6 + 7
       3 = 3 + 4 + 5
       4 = 2 + 3 + 4 + 5 + 7
       5 = 0 + 3 + 4 + 5 + 6
       6 = 0 + 1 + 4 + 5 + 6 + 7
       7 = 1 + 2 + 5 + 6 + 7
    $\alpha^{61}$ (G$_{15}$)
       0 = 0 + 2 + 3 + 5 + 7
       1 = 0 + 1 + 3 + 4 + 6
       2 = 0 + 1 + 3 + 4
       3 = 0 + 1 + 3 + 4 + 7
       4 = 1 + 3 + 4 + 7
       5 = 0 + 2 + 4 + 5
       6 = 0 + 1 + 3 + 5 + 6
       7 = 1 + 2 + 4 + 6 + 7
    $\alpha^{50}$ (G$_{16}$)
       0 = 0 + 6
       1 = 1 + 7
       2 = 0 + 2 + 6
       3 = 1 + 3 + 6 + 7
       4 = 2 + 4 + 6 + 7
       5 = 3 + 5 + 7
       6 = 4 + 6
       7 = 5 + 7
    $\alpha^{79}$ (G$_{17}$)
       0 = 1 + 2 + 3 + 4 + 5 + 7
       1 = 2 + 3 + 4 + 5 + 6
       2 = 1 + 2 + 6
       3 = 1 + 4 + 5
       4 = 0 + 1 + 3 + 4 + 6 + 7
       5 = 0 + 1 + 2 + 4 + 5 + 7
       6 = 0 + 1 + 2 + 3 + 5 + 6
       7 = 0 + 1 + 2 + 3 + 4 + 6 + 7
    $\alpha^{60}$ (G$_{18}$)
       0 = 0 + 1 + 3 + 4 + 6
       1 = 1 + 2 + 4 + 5 + 7
       2 = 1 + 2 + 4 + 5
       3 = 0 + 1 + 2 + 4 + 5
       4 = 0 + 2 + 4 + 5
       5 = 0 + 1 + 3 + 5 + 6
       6 = 1 + 2 + 4 + 6 + 7
       7 = 0 + 2 + 3 + 5 + 7
    $\alpha^{17}$ (G$_{19}$)
       0 = 1 + 4 + 6 + 7
       1 = 2 + 5 + 7
       2 = 1 + 3 + 4 + 7
       3 = 0 + 1 + 2 + 5 + 6 + 7
       4 = 0 + 2 + 3 + 4
       5 = 1 + 3 + 4 + 5
       6 = 2 + 4 + 5 + 6
       7 = 0 + 3 + 5 + 6 + 7
```

In the above table, the number to the left of the equal sign represents the number of the output, while the numbers to the right of the equal sign represents the numbers of the inputs. The plus sign represents addition modulo 2, which is equivalent to an exclusive-OR.

The mathematical meaning of the above table can best be illustrated by example. Multiplication of two elements of GF($2^m$), $Y(\alpha)$ and $A(\alpha)$, where $$Y(\alpha) = Y_{m-1}\alpha^{m-1} + Y_{m-2}\alpha^{m-2} + \ldots Y_0\alpha^0, \text{ and}$$

$$A(\alpha) = A_{m-1}\alpha^{m-1} + A_{m-2}\alpha^{m-2} + \ldots A_0\alpha^0$$

can be expressed $$Y(\alpha)A(\alpha) = Y_{m-1}\alpha^{m-1}(A_{m-1}\alpha^{m-1} + A_{m-2}\alpha^{m-2} \ldots A_0\alpha^0) +$$
$$Y_{m-2}\alpha^{m-2}(A_{m-1}\alpha^{m-1} + A_{m-2}\alpha^{m-2} + \ldots A_0\alpha^0) +$$
$$Y_0\alpha^0(A_{m-1}\alpha^{m-1} + A_{m-2}\alpha^{m-2} + \ldots A_0\alpha^0).$$

which leads to $$Y(\alpha)A(\alpha) = Y_{m-1}(A_{m-1}\alpha^{m-1}\alpha^{m-1} + A_{m-2}\alpha^{m-2}\alpha^{m-1} +$$
$$\ldots A_0\alpha^0\alpha^{m-1}) +$$
$$Y_{m-2}(A_{m-1}\alpha^{m-1}\alpha^{m-2} + A_{m-2}\alpha^{m-2}\alpha^{m-2} +$$
$$\ldots A_0\alpha^0\alpha^{m-2} +$$
$$Y_0(A_{m-1}\alpha^{m-1}\alpha^0 + A_{m-2}\alpha^{m-2}\alpha^0 + \ldots A_0\alpha^0\alpha^0$$
$$= Y_{m-1}A(\alpha^{m-1}) + Y_{m-2}A(\alpha^{m-2}) + Y_0A(\alpha^0)$$

Assume $A(\alpha) = \alpha^{190}$, which is the coefficient of $G_0$ of the generator polynomial $G(x)$. Then $$A(\alpha^0) = \alpha^{190}$$

$$A(\alpha^1) = \alpha^{191}$$

$$A(\alpha^2) = \alpha^{192}$$

$$A(\alpha^7) = \alpha^{197}, \text{ and}$$

$$Y(\alpha)\alpha^{190} = Y_7\alpha^{197} + Y_6\alpha^{196} + Y_5\alpha^{195} + \ldots Y_0\alpha^{190}.$$

From Table 1

$$\alpha^{190} = \alpha^7 + \alpha^5 + \alpha^3 + \alpha^2 + \alpha^1$$

$$\alpha^{191} = \alpha^6 + \alpha^0$$

$$\alpha^{192} = \alpha^7 + \alpha^1$$

$$\alpha^{193} = \alpha^4 + \alpha^3 + \alpha^0$$

$$\alpha^{194} = \alpha^5 + \alpha^4 + \alpha^1$$

$$\alpha^{195} = \alpha^6 + \alpha^5 + \alpha^2$$

$$\alpha^{196} = \alpha^7 + \alpha^6 + \alpha^3$$

$$\alpha^{197} = \alpha^7 + \alpha^3 + \alpha^2 + \alpha^0$$

Each of the $\alpha^i$ is an 8-tuple, as is the product $Y(\alpha)\alpha^{190}$, which can be represented by $Z(\alpha)$, $$Z(\alpha) = Y_1\alpha^0 + Y_3\alpha^0 + Y_7\alpha^0 + Y_0\alpha^1 + Y_2\alpha^1 + Y_4\alpha^1 +$$
$$Y_0\alpha^2 + Y_5\alpha^2 + Y_7\alpha^2 + Y_0\alpha^3 + Y_3\alpha^3 + Y_6\alpha^3 + Y_7\alpha^3 +$$
$$Y_3\alpha^4 + Y_4\alpha^4 + Y_0\alpha^5 + Y_4\alpha^5 + Y_5\alpha^5 +$$
$$Y_1\alpha^6 + Y_5\alpha^6 + Y_6\alpha^6 + Y_0\alpha^7 + Y_2\alpha^7 + Y_6\alpha^7 + Y_7\alpha^7$$

if $Z(\alpha)$ is represented by $$Z(\alpha) = Z_7\alpha^7 + Z_6\alpha^6 + \ldots Z_0\alpha^0, \text{ then}$$

$$Z_0 = Y_1 + Y_3 + Y_7$$

$$Z_1 = Y_0 + Y_2 + Y_4$$

$$Z_2 = Y_0 + Y_5 + Y_7$$

$$Z_3 = Y_0 + Y_3 + Y_6 + Y_7$$

$Z_4 = Y_3 + Y_4$ $Z_5 = Y_0 + Y_4 + Y_5$ $Z_6 = Y_1 + Y_5 + Y_6$ $Z_7 = Y_0 + Y_2 + Y_6 + Y_7$

From inspection, it can be seen then these last equations for $Z_i$ correspond to the Table 2 entry for $G_0 = \alpha^{190}$.

It can be seen from the above table that the multipliers $S_0$ through $S_{19}$ multiply the inputs by the fixed constants $\alpha^0$ through $\alpha^{19}$, respectively, while the multipliers $G_0$ through $G_{19}$ multiply the input by the corresponding coefficients of the generator polynominal G(x); i.e., $\alpha^{190}, \alpha^{188} \ldots \alpha^{17}$.

Each of the inputs to the multipliers $S_0$–$S_{19}$ are provided by the associated registers 30. In contrast, each of the inputs to multipliers $G_0$ to $G_{19}$ are provided from a single source, multiplexer 42. This results in the same symbol being multiplied by twenty constants, $G_0$ to $G_{19}$, in parallel.

The actual implementation of the above multiplier logic attempts to simplify the circuitry and reduce redundancy by sharing repeated logic patterns. For example, in the $S_2$ multiplier, the pattern "6+7" is repeated in equations "3" and "4". Only one "6+7" circuit need be implemented and its output provided as inputs to both the "3" and the "4" circuits. As can be appreciated, the logic associated with multipliers $G_0$–$G_{19}$ may be greatly simplified by making terms appearing in many different multipliers common to all. The actual choice of circuitry implementing the logic equations is deemed to be within the skill of the art.

In addition to the above, the following control lines are connected between the controller 12 and the ECC array 14: An initialize line 56 is connected between the controller 12 and the clear input of each of the registers 30. Activation of the initialized line clears each of the registers 30. A master clock line 58 is similarly connected between the controller 12 and each of the registers 30. Ten $\sigma$ enable clock signals 60 are connected respectively to ten of the registers 30, beginning with the register 62 connected to S1 as shown in FIG. 1. See FIG. 2. A multiplexer select line 1 is connected to the multiplexer select input of the top multiplexes 34. A multiplexer select line 2 is connected to the select input of the bottom multiplexes 36. An enable detection line is connected to AND Gate 46 and the select input of the feedback multiplexer 42. A read parity syndrome select line is connected to the enable input of feedback multiplexer 42 and the select input of output multiplexer 50. When "off" the B input of output multiplexer 50 are selected and feedback multiplexer 42 is disabled. When disabled, feedback multiplexer 42 outputs all zeros.

ENCODE

Having briefly described the error correction apparatus, its operation for encoding will now be described.

The transmitted code word can be broken down into two parts: The first part, the k information symbols and the second part, the 2t parity check symbols, each symbol being eight bits in length. The maximum number of symbols in a code word is 255 ($2^m - 1$, m=8). The number of parity check symbols for a ten-error-correcting Reed-Solomon code is twenty (t=10). In the following n is assumed to be equal to the length of the code word to be transmitted, and n−k equal to the number of parity check symbols. The transmitted code word expressed in polynomial form:

$$C(X) = \sum_{i=0}^{n-k-1} C_i X^i + \sum_{i=0}^{n-1} C_i X^i$$

where $$\sum_{i=0}^{n-1} C_i X^i = X^{n-k} I(X), \text{ and}$$

$$\sum_{i=0}^{n-k-1} C_i X^i = r(X),$$

r(X) being the remainder resulting from the division of $X^{n-k} I(X)$ by G(X), the generator polynomial, i.e., $$X^{n-k} I(X) + r(X) = Q(X) G(X), \text{ or}$$

$$C(X) = Q(X) G(X),$$

Q(X) being an unused quotient, and r(X) comprising the n−k parity check symbols.

The encoder apparatus divides $x^{n-k} I(X)$ by G(X) and transmits the remainder r(X) so it can be appended to $X^{n-k} I(X)$.

Figure 3:
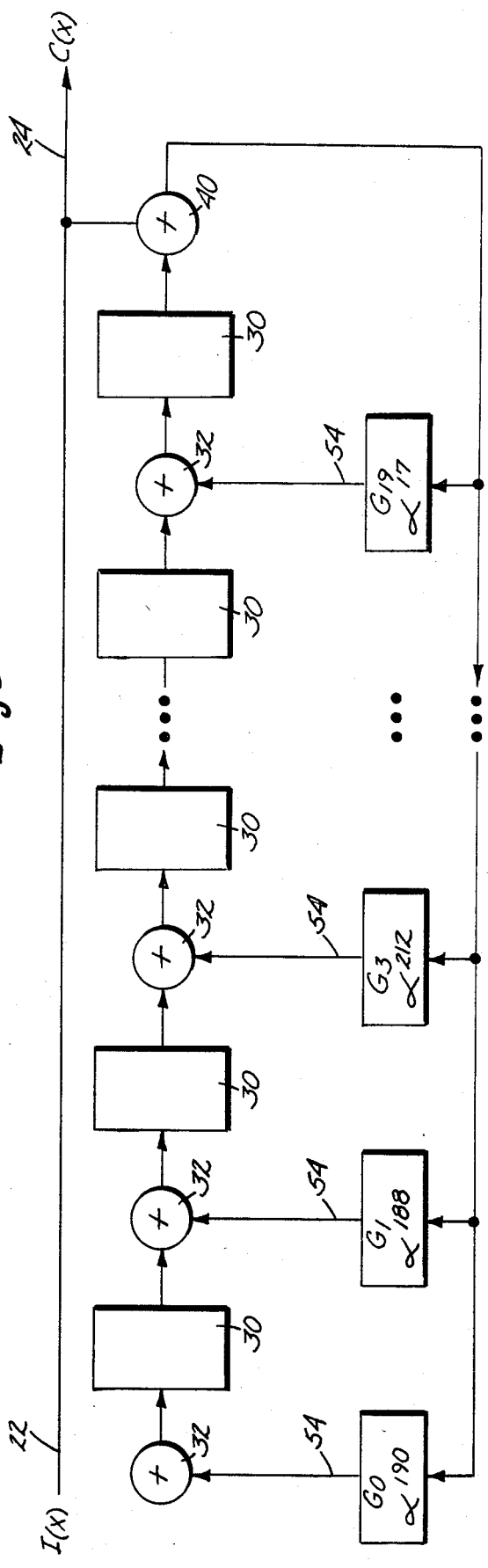
FIG. 3 is a block diagram of the ECC array connected to perform the Encode function.

The apparatus 10 encodes the information symbols as follows: The output multiplexer 50 is initially set to output on the ECC output data path 24 the ECC input data. The top multiplexers 34 are set to pass through the B inputs. The bottom multiplexers 36 are set to pass through the A inputs. Feedback multiplexer 42 is set to pass through the B inputs. AND gate 46 is disabled. When so conditioned, the ECC array 14 operates as the equivalent circuit shown in FIG. 3.

The information symbols are transmitted, one by one, highest order first, along ECC input data path 22. Each information symbol proceeds through the data path 22 to the lead exclusive-or gate 40, and then through the feedback multiplexer 42 into the multiplier array 44, where the symbol is multiplied by the twenty multiplier $G_0$ through $G_{19}$, which are the coefficients of the generator polynomial G(X). The multiplied outputs are immediately available on lines 54 and pass through the lower multiplexers 36 to one set of inputs to the exclusive-OR gates 32. For each information symbol, the master clock is clocked once thereby causing registers 30 to copy the information present at the exclusive-OR gates 32.

The copied information is then available on the outputs of the registers 30. The outputs, as aforementioned, are multiplexed through the top multiplexers 34 (B inputs) to a second set of inputs to the exclusive-OR gates 32. When a second information symbol is available on the ECC input data path 22, the results of the first symbol multiplied by $G_0$ through $G_{19}$ are exclusive-ORed with the results of the second symbol multiplied at exclusive-OR dates 32. When the second master clock appears, the register 30 copy the results of this exclusive-OR. This process continues until all information symbols have been clocked through the multiplier array 44.

As is known to the art, the above sequence of operations divides the information symbols, multiplied by $X^{n-k}$ by the generator polynomial G(X). After the division the remainder, which comprises twenty symbols, is left as a residue in registers 30. To retrieve the remainder, which are the parity check symbols, the controller selects the B inputs of multiplexer 50 to connect the output of register 38 with the ECC output data path 26; this also disables feedback multiplexer 42. This sends all the zeros to exclusive-OR gates 32. The setting of the top multiplexers 34 remains unchanged. This effectively transforms the exclusive-OR function 32 into an OR function to effectively transfer symbols from one register 30 to another unmodified.

Figure 4:
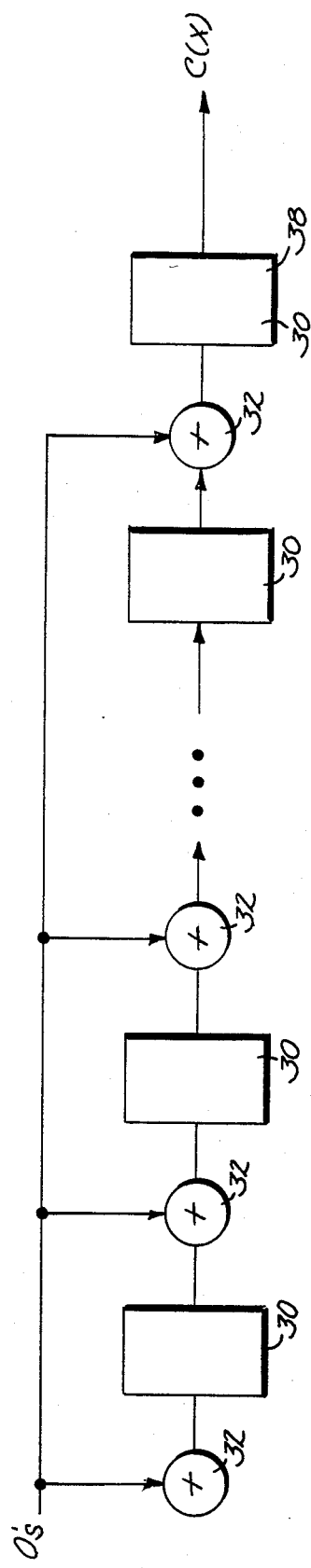
FIG. 4 is a block diagram of the ECC array connected to perform the shift-register function.

When so connected, the ECC array functions as the equivalent circuit shown in FIG. 4. When the output multiplexer 50 B inputs are first selected, the first parity symbol from register 38 is available. When the master clock clocks the registers, the symbols from preceding registers are copied into the next registers, and the second parity symbol is now available on the output of register 38. The master clock is pulsed 19 more times or a total of 20 times to clock out each parity symbol to the ECC output data path. After all parity symbols have been clocked out, the code word C(X) is complete.

It should be noted that the information symbols I(X) are provided highest order first. Assuming there are k information symbols, $I_0 + I_1X + I_aX^2 + \ldots I_{k-1}X^{k-1}$, symbol $I_{k-1}X^{k-1}$ appears first at the ECC input data path. This symbol is fed to the ECC array 14 for division. It also becomes the highest order C(X) output, which is an order $n-k$ greater than in the I(X) polynomial. This transposition effectively multiplies information symbol $I_{k-1}X^{k-1}$ by $X^{n-k}$, so that $$C_1X^{n-1} = X^{n-k}I_{k-1}X^{k-1} \text{ or}$$

$$C_1X^{n-1} = I_{k-1}X^{n-1}$$

The remainder r(X) is also provided to the ECC output data path 26 highest order first. Thus $$C_{n-k-1}X^{n-k-1} = r_{19}X^{19} \text{ and}$$

$$C_0 = r_0X^0.$$

It will be appreciated by those skilled in the art that feeding I(X) from the right end, after the highest order the register 38, is equivalent to dividing $X^{n-k}I(X)$ by G(X), as will become apparent when one considers a conventional division circuit described in the next section.

ERROR DETECTION

From the process of encoding we know that the code word C(X) is a multiple of the generator polynomial G(X) or $$C(X) = G(X)Q(X).$$

The division of the code word C(X) by the generator polynomial G(X) results in a remainder r(X) having a value of zero if the code word is received without error. Thus, for error detection, the apparatus is conditioned to divide the code word C(X) by the generator polynomial G(X) and test the remainder r(X) for a zero result by shifting the contents of the registers 30 out to the microprocessor which can perform the test for zero.

In operation, the circuit is conditioned in a slightly altered fashion to perform the division and testing. The controller 12 enables AND gate 46 by activation of the enable detection line from controller 12. The controller selects the A inputs of the lower multiplexers 36, the B inputs of the top multiplexers 34, and the A input of feedback multiplexer 42. When so configured, the ECC array appears as in FIG. 5.

The code word is provided, symbol by symbol, highest order first at the ECC data input path 22. The symbols are clocked through the registers 30, lowest order register to highest order register, and then fed back through feedback multiplexer 42 into the multiplier array 44, where the highest order symbol is multiplied by the multipliers $G_0$ through $G_{19}$, the coefficients of the generator polynomial. The process continues until each code word symbol has been clocked into the lowest order register 39, at which time the remainder from the division will be present in the registers 30.

Thereafter, the multiplexer 50 B inputs are selected to connect the register 38 to the ECC output data path 26. The feedback multiplexer is disabled and 0's are provided for symbols to exclusive-OR gates 32. The circuit is now equivalent to the circuit of FIG. 3. The registers 30 are clocked 20 times providing the remainder to the microprocessor for testing for a zero value. If any of the remainder symbols are nonzero, then an error has occurred in the code word C(X).

SYNDROME GENERATION

Assume that the code word C(X) was transmitted and that word $R(X) = C(X) + E(X)$ is the word received where E(X) is an error word That is $$R(X) = C(X) + E(X)$$

As C(X) is a multiple of the generator polynomial G(X) where $$G(X) = \prod_{i=0}^{2t-1} (X - \alpha^i)$$

$$C(X) = Q(X)(X - \alpha^0)(X - \alpha^1) \ldots (X - \alpha^{2t-1})$$

From the above we know that the code word $C(\alpha^i) = 0$ when $\alpha^i = \alpha^0, \alpha^1, \alpha^2 \ldots \alpha^{2t-1}$. Thus:

$$R(\alpha^i) = 0 + E(\alpha^i).$$

Furthermore we know that the received word R(X) is the transmitted code word C(X) if and only if the received word evaluated at each $\alpha^i$, $i = 0, 1, 2 \ldots 2t-1$, is zero. If an error has occurred then one or more of the evaluations of R(X) at $\alpha^i$, $i = 0, 1, 2 \ldots 2t-1$, will result in a nonzero value. The location of the error and its value may be calculated from these nonzero values (otherwise known as syndromes).

The 2t syndromes for the preferred embodiment are $S_i = R(\alpha^i)$, $i = 0, 1, 2 \ldots 19$, $t = 10$.

The syndrome component $S_i$ can be computed by dividing R(X) by $X - \alpha^i$. The division results in the equality:

$$R(X) = C(X)(X - \alpha^i) + B_i,$$

where the remainder $B_i$ is a constant in $GF(2^m)$. Substituting $\alpha^i$ for X in both sides of this equation we have:

$$R(\alpha^i) = C(\alpha^i)(\alpha^i - \alpha^i) + B_i,$$

$$S_i = 0 + B_i = B_i.$$

The division can be performed by a circuit such as shown in FIG. 6 where the received word R(X) is provided, symbol by symbol, as one set of inputs to exclusive-OR gates 32, which exclusive-OR bit by bit, the correspondingly ordered bits of its two input sets. The output of the exclusive-OR gate is stored, bit by bit, into a register 30. The output of register 30 is provided, bit by bit, to a multiply by $\alpha^i$ circuit 62. The eight ordered outputs from the multiplier circuit 62 are provided as the second input set to exclusive-OR gate 32.

After each of the symbols of the received code word R(X) have been clocked through a multiplied by $\alpha^i$ circuit 62. A residue or remainder comprising the syndrome $S_i$ remains in the register 30. The contents of this register 30 are then clocked out of the ECC array and into the microprocessor where the syndrome $S_i$ may be used in conjunction with the other nineteen syndromes to calculate the coefficients of the error locator polynomial.

Referring to FIG. 1 the control circuit conditions the ECC array to calculate the syndromes $S_i$, i=0, 1, 2 ... 19 by selecting the A inputs of the top multiplexers 34 and selecting the B inputs of the bottom multiplexers 36. The selection of the A inputs of the top multiplexer 34 latches the multipliers $S_0, S_1 \ldots S_{19}$ into exclusive-OR gates 32 as shown in FIG. 6. The selection of the B inputs of the lower multiplexers causes the ECC input data path 22 to be coupled to the other inputs to exclusive-OR gates 32. These are equivalent to the R(X) inputs in FIG. 6. The received word R(x) is provided, symbol by symbol, on ECC input data 22, highest order first. Thereafter the array is clocked n times computing the twenty syndromes $S_0, S_1 \ldots S_{19}$ in parallel.

After the syndromes have been computed, the syndromes are present in the registers 30. The controller 12 then selects the B input of the top multiplexers the 34 A inputs of the lower multiplexers 36 and disables feedback multiplexer 42 to supply zero symbol data to exclusive-OR gates 32 and clocks the ECC array 20 twenty times thereby reading out of the array along ECC output data path 24 all twenty syndromes.

CHIEN SEARCH

After the microprocessor has received the syndromes $S_i$, i=0, 1, 2 ... 19, it calculates the coefficients of the error locator polynomial $\sigma(X)$ from the syndromes by use of the Berlekamp algorithm. Once the coefficients of $\sigma(X)$ are known the evaluation of the polynomial:

$$\sigma(X) = \sigma_{10}X^{10} + \sigma_9 X^9 + \sigma_8 X^8 + \ldots \sigma_2 X^2 + \sigma_1 X + 1,$$

at $\alpha^i$ yields an error location at $\alpha^{-i}$ if $\sigma(\alpha^i)=0$. This is equivalent to:

$$\sigma_{10}(\alpha^i)^{10} + \sigma_9(\alpha^i)^9 + \ldots + \sigma_2(\alpha^i)^2 + \sigma_1(\alpha^i) = 1$$

Figure 2:
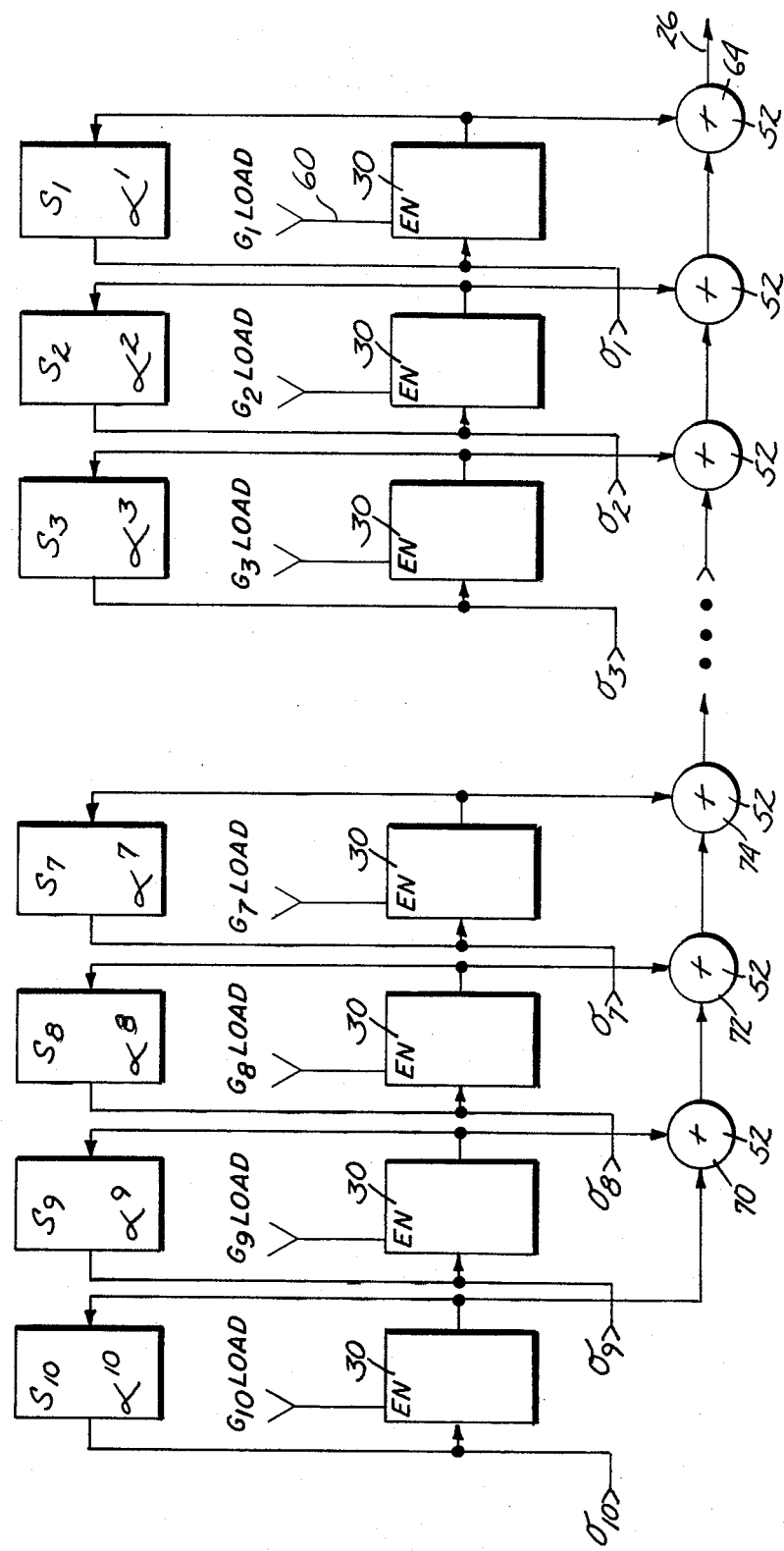
FIG. 2 is a block diagram of the ECC array connected to perform the Chien search function.

A circuit as shown in FIG. 2 performs the Chien search function. The circuit is comprised of ten registers 30, ten multipliers $S_1, S_2, S_3 \ldots S_{10}$, which multiply the contents of the registers 30 by the corresponding power of $\alpha$ and provide feedback into registers 30, and nine modulo 2 addition gates 52 serially connected to one another and also connected to the outputs of the registers 30. An additional input to register 30 comprises the coefficients of the error locator polynomial $\sigma_1, \sigma_2, \ldots \sigma_{10}$. These are initially loaded into the registers 30. Thereafter the registers are clocked once to form in the registers 30 the values $\sigma_{10}\alpha^{10}, \sigma_9\alpha^9, \sigma_8\alpha^8 \ldots \sigma_1\alpha^1$. The modulo 2 addition of these registers by adders 52 forms at the Chien search output 64 the evaluation of the error locator polynomial at $\alpha$, i.e., $\sigma(\alpha)-1$. The outputs are evaluated by controller 12. If the results of this evaluation are identical to 1, i.e., the eight-bit symbol at the Chien search output has only its least significant bit with nonzero value, then an error location has been found. The location of the error is $\alpha^{-1}$. The location $\alpha^{-1}$ corresponds to the $X^{254}$ location in the received word R(X) because $\alpha^{-1} = \alpha^{255-1} = \alpha^{254}$, the code being multiplicative cyclic.

When the controller identifies a Chien Search output symbol having a value of 1, it signals this fact to the microprocessor. The actual location of the error is established by a counter in the microprocessor.

To evaluate the error locator polynomial at $\alpha^2$ the registers 30 are clocked one more time thereby again multiplying the contents registers 30 by the powers of $\alpha^i$, i=1, 2, ... 10. If an error is found, location $X^{253}$ is in error. To evaluate the error polynomial at each possible location of the received word R(X) the registers must be clocked a total of 255 times which corresponds to the maximum length of the code word. However, one is not normally interested in errors occurring in the parity check symbols. Therefore, registers 30 need only be clocked 255−2t times, where t is the number of errors, as the parity check symbols occur in the lowest order locations of the code word R(X), i.e., $$R_0, R_1X, R_2X^2 \ldots R_{2t-1}X^{2t-1}$$

Referring to FIG. 1 the controller 12 conditions the error correction array 14 to perform the Chien search function by initially loading the coefficients of the error locator polynomials $\sigma(X)$ into registers 30 corresponding to multipliers $S_1$ through multiplier $S_{10}$ as follows: The registers 30 are first initialized to zero and the B inputs of the lower multiplexers are selected thereby connecting the ECC input line input data path 22 to exclusive-OR gates 32. As the contents of the registers 30 are zero the exclusive OR gates 32 will pass the information on the ECC input data path lines 22 unchanged into the registers 30 if the information is loaded into the registers from right to left in the figure. Thus the coefficients of the error polynomial $\sigma(X)$ are presented with the lowest order coefficient $\sigma_1$ first and the highest order coefficient $\sigma_{10}$ last. When $\sigma_1$ is transmitted to the ECC array 14 by the microprocessor, the controller 12 enables and clocks register 62 via the $\sigma_1$ enable 60 and master clock 58. A similar procedure is performed for $\sigma_2$ through $\sigma_{10}$ individually clocking into the registers 30 the respective coefficients of the error locator polynomial. Once the coefficients have been loaded, the controller 12 presents symbols of zero value on the ECC input data lines 22 thereby effectively changing the exclusive-OR gates 32 into OR gates which pass the information presented by the upper multiplexers unchanged into the registers 30. The controller selects the A inputs of the upper multiplexers 34 to connect the multipliers $S_1, S_2, \ldots S_{10}$ into exclusive-OR gates 32. The registers 30 are then clocked once to evaluate the error locator polynomial at $\alpha^1$. The outputs of the registers "$S_1$" through "$S_{10}$" are fed into exclusive-OR gates 52 connected as shown in FIG. 2 so that the modulo 2 sum of the registers appears at the Chien search output 64. This output is provided as a feedback to controller 12 which, in turn, tests for one and, provides the test results as feedback to the microprocessor. Whenever the Chien search output is identical to one, as discussed above, an error location has been found. The controller clocks the registers $2^m - 2t - 1$ times where m is the length of the code symbol and 2t are the number of parity check symbols.

After the error locations have been found the values of the error at the locations can be found by solving the error value formula for the $Y_i$ as described above.

BURST ERROR TRAPPING

The circuit of the present invention can also perform burst error trapping. Reed-Solomon codes are cyclic and therefore may be used for trapping single burst errors to a maximum length of t, where t is the error correction capability of the code, provided the errors are confined to contiguous symbols within a code word.

To trap a burst error the controller 12 selects the B inputs of the upper multiplexers 34, the A input of the lower multiplexors 36 and the B input of multiplexor 42. The circuit in this arrangement is set to divide the received word $X^{n-k}R(X)$ by the generator polynomial $G(X)$. The incoming received word $R(X)$ is cycled symbol by symbol into the ECC circuit, highest order first. The array 14 is clocked n times for the n symbols of the received word $R(X)$. After all the symbols of the received word $R(X)$ have been clocked into ECC array 14, the controller 12 disables the ECC input date path 22 by providing all-zero symbols. Next the controller clocks the registers 30 and additional $n-2t$ times where n is the length of the code or until t or more zeros are detected at the encoder output data path. At this point the magnitude of the burst error now exists in the next t or fewer registers 30 and may be used for the correction of the burst error by direct modulo 2 addition of the contents of the next t or fewer nonzero symbols to the correspondingly shifted received word symbols. See, e.g., Chapter 11 of Peterson and Weldon, *Error-Correcting Codes*, 2nd ed. (1972), especially at Section 11.3.

The enumeration of the elements of the preferred embodiment should not be taken as a limitation on the scope of the appended claims, in which I claim:

1. A Reed-Solomon calculation apparatus comprising:

a set of 2t registers, where t is the number of errors to be corrected, each register adapted to hold m bits, m being an arbitrary number;

a set of 2t exclusive-OR gates, each gate adapted to, by order, exclusive-or two ordered m-bit sets of inputs and provide a set of ordered outputs, the outputs of the respectively ordered gate connected to the inputs of the correspondingly ordered register;

a set of 2t top multiplexers, each adapted to select between two ordered sets of m-bit inputs and place the selected set on m ordered outputs, a first set of inputs being an A set, a second set of inputs being a B set, the outputs of the respectively ordered multiplexer connected to a first set of ordered inputs of the correspondingly ordered exclusive-OR gate;

a set of 2t bottom multiplexers, each adapted to select between two ordered sets of m-bit inputs and place the selected set on m ordered outputs, a first set of inputs being an A set, a second set of inputs being a B set, the outputs of the respectively ordered multliplexer connected to a second ordered set of inputs of the correspondingly ordered exclusive-OR gate;

a first set of 2t Galois Field multipliers, each adapted to multiply an ordered m-bit input by $\alpha^i$, where i corresponds to the order of the multiplier, i=0, 1, 2 ... 2t−1, and $\alpha^i$ is an m-tuple of Galois Field ($2^m$), the inputs of the respectively ordered multipliers connected to the outputs of the inversely respectively ordered registers, and the outputs of the respectively ordered multipliers connected to the A input set of the inversely respectively ordered top multiplexers;

a second set of 2t Galois Field multipliers, each respectively ordered multiplier adapted to multiply an ordered m-bit input by the correspondingly ordered coefficient of a generator polynomial $G(X)$ derived from the equation $$G(X) = \prod_{i=0}^{2t-1} (X - \alpha^i),$$

and the outputs of the respectively ordered multipliers connected to the A input set of the inversely respectively ordered bottom multiplexers;

a feedback multiplexer adapted to select between two ordered sets of m-bit inputs and place the selected set on m ordered outputs, a first set of inputs being an A set, a second set of inputs being a B set, the outputs connected to the inputs of each of said second set of Galois Field multipliers, the outputs of the highest order of said registers connected to the A input set of the feedback multiplexer;

a lead exclusive-OR gate adapted to, by order, exclusive-OR two ordered m-bit sets of inputs and provide a set of ordered outputs, a first set of inputs connected to the outputs of the highest order of said registers, the outputs of the lead exclusive-OR gate connected to the B input set of said feedback multiplexer;

an ECC output data path connected to the outputs of the highest order of said registers;

an ECC input data path comprising m ordered bits connected to a second set of inputs to said lead exclusive-OR gate and to the B input set of each of said lower multiplexers;

an AND gate for logically ANDing an enable detection signal with the m ordered bits of said ECC input data path and providing the ordered resultant to the B input set of the lowest order top multiplexer;

t ordered $\sigma$-enable signals, $\sigma_i$, i=1, 2, 3 ... t, connected to the registers connected to the correspondingly ordered first set of Galois Field multipliers;

t−1 ordered Chien exclusive-OR gates, each gate adapted to, by order, exclusive-or two ordered m-bit sets of inputs and provide a set of ordered outputs, a first set of inputs connected to the outputs of the register connected to the correspondingly ordered first Galois Field multiplier, a second set of inputs connected to the outputs of the next higher order Chien exclusive-OR gate, save for the highest order gate, whose second set of inputs is connected to the outputs of the register connected to the next highest order Galois Field multiplier, the outputs from the lowest order gate comprising a Chien search output data path;

a controller means including means for selectively selecting the A or B input set of each of said multiplexers, for providing said enable detection signal, for selectively providing said $\sigma$-enable signals, for providing a signal for clearing each of said registers, and for providing a signal to clock each of said registers.

2. The apparatus of claim 1 wherein m=8, said Galois Field ($2^m$) is Galois Field ($2^8$) and $\alpha$ is a root of the irreducible polynomial $$P(X) = X^8 + X^4 + X^3 + X^2 + 1.$$

* * * * *